United States Patent
Nobukuni et al.

(10) Patent No.: US 12,070,769 B2
(45) Date of Patent: Aug. 27, 2024

(54) LIQUID PROCESSING APPARATUS AND LIQUID PROCESSING METHOD

(71) Applicant: Tokyo Electron Limited, Tokyo (JP)

(72) Inventors: Chikara Nobukuni, Koshi (JP); Tomoaki Ojima, Koshi (JP); Takuya Itahashi, Koshi (JP); Ryoichi Horiguchi, Koshi (JP); Shota Wakayama, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/129,150

(22) Filed: Mar. 31, 2023

(65) Prior Publication Data

US 2023/0234091 A1    Jul. 27, 2023

Related U.S. Application Data

(62) Division of application No. 16/918,678, filed on Jul. 1, 2020, now Pat. No. 11,691,172.

(30) Foreign Application Priority Data

Jul. 2, 2019    (JP) ................................. 2019-123898

(51) Int. Cl.
*B05C 3/02* (2006.01)
*B05C 11/10* (2006.01)
*H01L 21/67* (2006.01)

(52) U.S. Cl.
CPC ............ *B05C 3/02* (2013.01); *B05C 11/1015* (2013.01); *B05C 11/1026* (2013.01);
(Continued)

(58) Field of Classification Search
None
See application file for complete search history.

(56) References Cited

U.S. PATENT DOCUMENTS 2,006,865 A * 7/1935 Lake ........................ F23K 5/16
                                                    137/565.33
2,363,200 A   11/1944 Pew et al.
(Continued)

FOREIGN PATENT DOCUMENTS

JP    H4-281808 A    10/1992
JP    2013-45972 A    3/2013
(Continued)

*Primary Examiner* — Jethro M. Pence
(74) *Attorney, Agent, or Firm* — Nath, Goldberg & Meyer; Jerald. L. Meyer; Tanya E. Harkins

(57) ABSTRACT

A liquid processing apparatus includes: a tank configured to store a processing liquid supplied from a processing liquid supply source; a circulation passage connected to the tank; a pump installed at the circulation passage; a plurality of liquid processors configured to perform liquid processing on a substrate; and a plurality of supply passages configured to supply the processing liquid to the plurality of liquid processors respectively, wherein the circulation passage includes a main passage portion provided with the pump, and a first branch passage portion and a second branch passage portion branching from the main passage portion, and the processing liquid flowing out from the tank passes through the main passage portion, then flows into the first branch passage portion and the second branch passage portion, and then returns to the tank through the first branch passage portion and the second branch passage portion.

10 Claims, 8 Drawing Sheets

(52) U.S. Cl.
CPC ...... *B05C 11/1039* (2013.01); *B05C 11/1042* (2013.01); *H01L 21/67023* (2013.01)

(56) References Cited

U.S. PATENT DOCUMENTS

| | | | |
|---|---|---|---|
| 2,999,538 A | 9/1961 | Hullmann | |
| 3,592,159 A | 7/1971 | Murphy | |
| 4,019,530 A | 4/1977 | Chandroga | |
| 5,174,855 A | 12/1992 | Tanaka | |
| 6,589,338 B1 | 7/2003 | Nakamori et al. | |
| 6,878,216 B2 | 4/2005 | Fujishima | |
| 7,004,185 B2 | 2/2006 | Mueller et al. | |
| 8,807,072 B2 | 8/2014 | Shimai et al. | |
| 9,192,878 B2 | 11/2015 | Mizota et al. | |
| 9,255,331 B2 | 2/2016 | Tanaka et al. | |
| 9,278,768 B2 | 3/2016 | Kasahara et al. | |
| 9,488,087 B2 * | 11/2016 | Mergner | B05C 3/109 |
| 9,539,607 B2 | 1/2017 | Kuwahara et al. | |
| 9,862,179 B2 | 1/2018 | Hill et al. | |
| 10,037,901 B2 | 7/2018 | Koyama et al. | |
| 10,162,371 B2 * | 12/2018 | Takaki | G05D 11/138 |
| 10,177,013 B2 | 1/2019 | Zuo | |
| 10,373,849 B2 | 8/2019 | Minamida et al. | |
| 10,381,233 B2 | 8/2019 | Kagawa et al. | |
| 10,422,551 B2 * | 9/2019 | Nakayama | F24H 1/0072 |
| 10,500,617 B2 | 12/2019 | Mizota | |
| 10,573,539 B2 | 2/2020 | Komiya et al. | |
| 10,591,935 B2 * | 3/2020 | Takaki | G05D 11/138 |
| 10,632,491 B2 | 4/2020 | Ueda et al. | |
| 10,755,950 B2 | 8/2020 | Nakai | |
| 10,910,234 B2 | 2/2021 | Okuya | |
| 11,033,925 B2 | 6/2021 | Juvert Vila et al. | |
| 11,088,035 B2 | 8/2021 | Vronsky et al. | |
| 11,148,150 B2 | 10/2021 | Choi et al. | |
| 11,208,725 B2 | 12/2021 | Mizunaga et al. | |
| 11,273,464 B2 | 3/2022 | Shimmura et al. | |
| 11,318,504 B2 | 5/2022 | Kawaguchi et al. | |
| 11,437,251 B2 * | 9/2022 | Sakurai | H01L 21/67051 |
| 2013/0074488 A1 | 3/2013 | Mcbride et al. | |
| 2013/0074949 A1 | 3/2013 | Mcbride et al. | |
| 2013/0220478 A1 | 8/2013 | Kasahara et al. | |
| 2014/0120264 A1 | 5/2014 | Inatomi et al. | |
| 2015/0328668 A1 | 11/2015 | Koyama et al. | |
| 2016/0093515 A1 | 3/2016 | Namba | |
| 2018/0358240 A1 | 12/2018 | Komiya et al. | |
| 2020/0273725 A1 | 8/2020 | Sakurai | |
| 2021/0280438 A1 | 9/2021 | Sato et al. | |
| 2021/0313191 A1 | 10/2021 | Negoro et al. | |
| 2022/0219209 A1 | 7/2022 | Kawaguchi et al. | |

FOREIGN PATENT DOCUMENTS

| | | |
|---|---|---|
| JP | 2014-93506 A | 5/2014 |
| JP | 2015-220318 A | 12/2015 |
| JP | 2018-133558 A | 8/2018 |
| KR | 10-2016-0117292 A | 10/2016 |
| KR | 10-2019-0046691 A | 5/2019 |

* cited by examiner

LIQUID PROCESSING APPARATUS AND
LIQUID PROCESSING METHOD

This is a Divisional Application of U.S. patent application Ser. No. 16/918,678, filed Jul. 1, 2020, an application claiming benefit from Japanese Application No. 2019-123898, filed Jul. 2, 2019, the content of each of which is hereby incorporated by reference in its entirety.

CROSS-REFERENCE TO RELATED APPLICATION

This application is based upon and claims the benefit of priority from Japanese Patent Application No. 2019-123898, filed on Jul. 2, 2019, the entire contents of which are incorporated herein by reference.

TECHNICAL FIELD

The present disclosure relates to a liquid processing apparatus and a liquid processing method.

BACKGROUND

A semiconductor device manufacturing process includes a step of supplying a predetermined processing liquid to a workpiece such as a semiconductor wafer and performing liquid processing such as cleaning or wet etching. Patent Document 1 describes an example of a processing liquid supply mechanism provided in a liquid processing apparatus that performs such liquid processing. The processing liquid supply mechanism described in Patent Document 1 includes a storage tank that stores the processing liquid, and a circulation line (circulation pipeline) whose both ends are connected to the storage tank. The circulation line includes a heater that heats the processing liquid, a circulation pump that feeds the processing liquid, and a filter that removes contaminants such as particles contained in the processing liquid from the storage tank in order from the upstream side. A plurality of branch supply lines branch from the circulation line, and each of the branch supply lines supplies the processing liquid to a processing part that processes a substrate.

PRIOR ART DOCUMENTS

Patent Documents

Japanese laid-open publication No. 2015-220318

SUMMARY

According to an embodiment of the present disclosure, there is provided a liquid processing apparatus including: a tank configured to store a processing liquid supplied from a processing liquid supply source; a circulation passage connected to the tank; a pump installed at the circulation passage; a plurality of liquid processors configured to perform liquid processing on a substrate; and a plurality of supply passages configured to supply the processing liquid to the plurality of liquid processors respectively, wherein the circulation passage includes a main passage portion provided with the pump, and a first branch passage portion and a second branch passage portion branching from the main passage portion, and the processing liquid flowing out from the tank passes through the main passage portion, then flows into the first branch passage portion and the second branch passage portion, and then returns to the tank through the first branch passage portion and the second branch passage portion, wherein the liquid processors are divided into a first processor group to which a portion of the liquid processors belong and a second processor group to which another portion of the liquid processors belong, wherein the plurality of supply passages are divided into a first passage group to which a portion of the plurality of supply passages belong and a second passage group to which another portion of the plurality of supply passages belong, wherein the liquid processors belonging to the first processor group are connected to the first branch passage portion via the supply passages belonging to the first passage group respectively, and wherein the liquid processors belonging to the second processor group are connected to the second branch passage portion via the supply passages belonging to the second passage group respectively.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
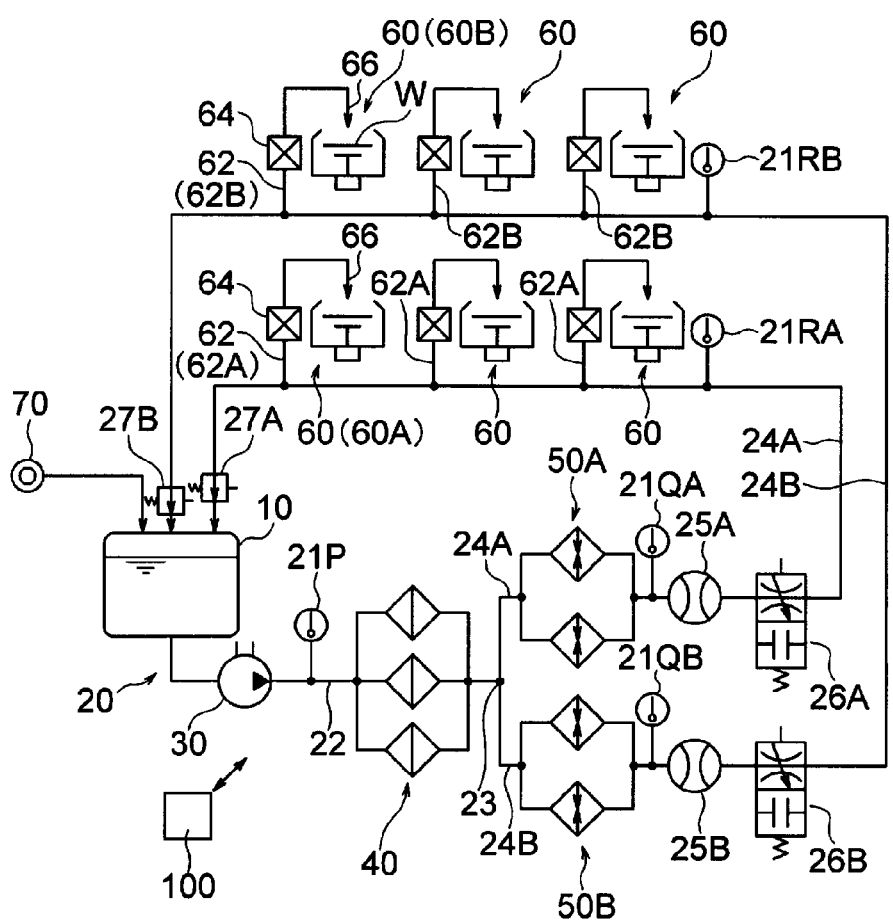
FIG. 1 is a fluid circuit diagram of a liquid processing apparatus according to a first embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of a liquid processing apparatus will be described with reference to the accompanying drawings. Throughout the drawings, the same or substantially the same members are denoted by the same reference numerals.

FIG. 1 shows a liquid processing apparatus according to a first embodiment of the present disclosure. The liquid processing apparatus includes a processing liquid supply mechanism. The processing liquid supply mechanism includes a tank 10 that stores a processing liquid supplied from a processing liquid supply source 70, and a circulation passage 20 connected to the tank 10. A pump 30 installed at the circulation passage 20 forms a circulation flow of the processing liquid that starts flowing from the tank 10 and returns to the tank 10 through the circulation passage 20.

The circulation passage 20 includes a main passage portion (a stem pipe portion) 22 at the upstream side, and a plurality of (two in the shown example) branch passage portions 24A and 24B (hereinafter also referred to as a "first branch passage portion 24A" and a "second branch passage portion 24B") at the downstream side.

Hereinafter, in the present disclosure, a letter at the end of a reference numeral given to an element pertaining to the first branch passage portion 24A is "A", and a letter at the end of a reference numeral given to an element pertaining to the second branch passage portion 24B is "B." The element pertaining to the first branch passage portion 24A and the element pertaining to the second branch passage portion 24B are the same as or substantially the same. When it is not necessary to distinguish the element pertaining to the first branch passage portion 24A and the element pertaining to the second branch passage portion 24B from each other, the letters "A" and "B" at the end may be deleted (for example, 40A and 40B are described as 40). In addition, the element whose reference character has the letter "A" at the end may be called a "first (name of the element)", and the element whose reference character has the letter "B" at the end may be called a "second (name of the element)." Further, the "first . . ." and the "second . . . " may be omitted.

A filtering part (or a filter) 40 removes contaminants such as particles contained in the processing liquid passing through the filtering part. The filtering part 40 includes a plurality of (three in the shown example) filter modules provided in parallel. The number of filter modules belonging to one filtering part 40 may be determined in consideration of a filtering capability required for the filtering part, a pressure drop allowed in the filtering part, and the like. In all the figures attached to the present application, one symbol indicated by a diamond (square) with a vertical line drawn in the center represents one filter module.

The main passage portion 22 branches at its downstream end, that is, a branch (branch point) 23 set on the downstream side of the pump 30, into the first branch passage portion 24A and the second branch passage portion 24B. The processing liquid flowing out of the tank 10 passes through the main passage portion 22, then flows into the first branch passage portion 24A and the second branch passage portion 24B, and then returns to the tank 10 through the first branch passage portion 24A and the second branch passage portion 24B.

The liquid processing apparatus includes a plurality of liquid processing units (or liquid processors) 60 that perform liquid processing on a substrate W (for example, a semiconductor wafer). The liquid processing units 60 have the same configuration. Each liquid processing unit 60 may include, for example, a spin chuck that holds and rotates the substrate W, and a nozzle 66 that supplies the processing liquid to the substrate W that is held and rotated by the spin chuck.

The liquid processing units 60 are divided into the same number of groups (two in the shown example) as the number of branch passage portions 24A and 24B. The processing liquid is supplied to liquid processing units 60A belonging to the first group from the first branch passage portion 24A. Therefore, a plurality of supply passages 62 (62A) branch in parallel from the first branch passage portion 24A and are connected to any one of the liquid processing units 60A belonging to the first group. The processing liquid is supplied to liquid processing units 60B belonging to the second group from the second branch passage portion 24B. Therefore, a plurality of supply passages 62 (62B) branch in parallel from the second branch passage portion 24B and are connected to any one of the liquid processing units 60B belonging to the second group. The number of liquid processing units 60A and 60B belonging to each group is the same.

For simplification of the figure, FIG. 1 (the same applies to FIG. 2 and FIG. 7) shows an example in which three liquid processing units 60 belong to one group. The number of liquid processing units belongs to one group is not limited to three. For example, the number of liquid processing units belonging to one group may be about 6 to 10.

A flow control device 64 is installed at each supply passage 62. The flow control device 64 includes one or more of an opening/closing valve, a flow rate control valve, a flow meter, a liquid flow controller, and the like. A downstream end of the supply passage 62 is connected to a nozzle 66 that supplies the processing liquid to the substrate W. Therefore, it is possible to supply the processing liquid from the nozzle 66 to the substrate W loaded in the liquid processing unit 60 at a controlled flow rate.

A temperature control unit (or a temperature controller) 50 (50A), a temperature sensor 21Q (21QA), a flow meter 25 (25A), an opening/closing valve 26 (26A) with an opening adjustment function, and a temperature sensor 21R (21RA) are installed at the branch passage portion 24A in order from the upstream side. A temperature control unit 50 (50B), a temperature sensor 21Q (21QB), a flow meter 25 (25B), an opening/closing valve 26 (26B) with an opening adjustment function, and a temperature sensor 21R (21RB) are installed at the branch passage portion 24B in order from the upstream side.

The temperature control unit 50 controls the temperature of the processing liquid passing through the temperature control unit. Each temperature control unit 50 includes a plurality of (four in the shown example) temperature control modules provided in parallel. Each temperature control module may be a module that exclusively performs heating, such as a resistance heater or a lamp heater, or a heating/cooling module including a temperature control element (for example, a Peltier element) capable of both heating and cooling.

The number of temperature control modules belonging to one temperature control unit 50 can be determined in consideration of temperature control capability required for the temperature control unit 50 and the pressure drop allowed in the temperature control unit 50. In the shown example, each temperature control unit 50 (50A or 50B) is composed of two temperature control modules arranged in parallel. In all the figures attached to the present application, one symbol indicated by a diamond (square) with two opposite vertical arrows drawn in the center represents one temperature control module.

The liquid processing apparatus includes a controller 100. The controller 100 is, for example, a computer and includes a control arithmetic part and a storage part. The storage part stores a program that controls various processes performed in the liquid processing apparatus. The control arithmetic part controls the operations of various components of the liquid processing apparatus by reading and executing the program stored in the storage part. The program may be recorded in a computer-readable storage medium, and may be installed in the storage part of the controller 100 from the storage medium. The computer-readable storage medium includes, for example, a hard disk (HD), a flexible disk (FD), a compact disk (CD), a magnetic optical disk (MO), a memory card and the like.

The controller 100 maintains the temperature of the processing liquid supplied from the first branch passage portion 24A to the liquid processing unit 60A at a target value by controlling a temperature control operation (heating and/or cooling operation) of the temperature control unit 50A based on temperatures detected by a temperature sensor 21P near an outlet of the pump 30, the temperature sensor 21QA near an outlet of the temperature control unit 50A, and the temperature sensor 21RA immediately upstream of a connection region of the supply passage 62A of the first branch passage portion 24A.

Similarly, the controller 100 maintains the temperature of the processing liquid supplied from the second branch passage portion 24B to the liquid processing unit 60B at a target value by controlling the temperature control operation (heating and/or cooling operation) of the temperature control unit 50B based on temperatures detected by the temperature sensor 21P near the outlet of the pump 30, the temperature sensor 21QB near the outlet of the temperature control unit 50B, and the temperature sensor 21RB immediately upstream of the connection region of the supply passage 62B of the second branch passage portion 24B.

The control of the temperature control unit 50A and the control of the temperature control unit 50B are independent of each other.

Specifically, the controller 100 feedback-controls the temperature control operation (heating and/or cooling operation) of the temperature control unit 50A (50B) based on the temperature detected by the temperature sensor 21QA (21QB) near the outlet of the temperature control unit 50A (50B) so that the temperature detected by the temperature sensor 21QA (21QB) is maintained at a set temperature. The set temperature corresponds to a set value SV in a feedback control system, and the temperature detected by the temperature sensor 21QA (21QB) corresponds to a measured value PV in the feedback control system.

The temperature detected by the temperature sensor 21RA (21RB) near the liquid processing unit 60A (60B) is the closest to the temperature of the processing liquid actually supplied to the substrate W. The temperature of the processing liquid decreases due to natural heat dissipation in the branch passage portion 24A (24B) until it is supplied to the substrate W after flowing out from the temperature control unit 50A (50B). The controller 100 corrects the set value (SV) or a manipulated variable (MV) in a feedback control system according to a difference between the temperature detected by the temperature sensor 21QA (21QB) and the temperature detected by the temperature sensor 21RA (21RB). Specifically, in the case where the temperature detected by the temperature sensor 21RA (21RB) is lower than the temperature detected by the temperature sensor 21QA (21QB) by, for example, 1 degree C., it may be considered that 1 degree C. as a correction value (CV) is added to the set value (SV). In the case where the difference between the temperature detected by the temperature sensor 21RA (21RB) and the temperature detected by the temperature sensor 21QA (21QB) is negligible, the correction based on the temperature detected by the temperature sensor 21RA (21RB) may not be performed.

The temperature sensor 21P near the outlet of the pump 30 is provided to perform feedforward control. When a new processing liquid is replenished from the processing liquid supply source 70 into the tank 10, the processing liquid having a relatively low temperature flows from the tank 10 into the temperature control unit 50A (50B). Since the feedback control is performed based on the temperature detected by the temperature sensor 21QA (21QB) near the outlet of the temperature control unit 50A (50B), the heat generation amount of the temperature control unit 50A (50B) does not increase until the temperature detected by the temperature sensor 21QA (21QB) decreases. Therefore, when the feedforward control is not performed, the processing liquid having a relatively low temperature temporarily flows through the branch passage portion 24A (24B) toward the liquid processing unit 60A (60B). In addition, when trying to compensate for the decrease in the temperature detected by the temperature sensor 21QA (21QB), the temperature of the processing liquid flowing out from the temperature control unit 50A (50B) may fluctuate.

In the feedforward control, the set value (SV) or the manipulated variable (MV) in the feedback control system is corrected according to a difference between the temperature detected by the temperature sensor 21P and the set temperature (the temperature to be detected by the temperature sensor 21QA (21QB)). Specifically, for example, in the case where it is detected that the detected temperature of the temperature sensor 21RA (21RB) is lower than the set temperature by, for example, 5 degrees C., it may be considered that 5 degrees C. as a correction value (CV) is temporarily added to the set value (SV). A timing at which the correction value (CV) is added to the set value (SV) can be experimentally determined in consideration of time until the flow of the processing liquid reaches the temperature control unit 50A (50B) from the temperature sensor 21P, a control responsiveness of the feedback control system, and the like. By performing the feedforward control, when the temperature of the processing liquid flowing into the temperature control unit 50A (50B) is relatively rapidly decreased, temperature fluctuation of the processing liquid supplied to the liquid processing unit 60A (60B) can be suppressed.

The feedforward control may be performed only when it is expected that a large disturbance, such as a disturbance when the tank 10 is replenished with a new processing liquid from the processing liquid supply source 70, will be applied to the temperature control system.

The opening/closing valve 26A (26B) with an opening adjustment function can adjust the flow rate of the processing liquid flowing through the branch passage portion 24A (24B), and can cut off the flow of the processing liquid through the branch passage portion 24A (24B). The flow meter 25A (25B) can monitor the flow rate of the processing liquid flowing through the branch passage portion 24A (24B).

A back pressure valve 27A (27B) is provided at the most downstream portion of the branch passage portion 24A (24B).

The processing liquid supply source 70 can supply (or replenish) the processing liquid to the tank 10. An example of the processing liquid supplied from the processing liquid supply source 70 is DHF (dilute hydrofluoric acid). The processing liquid supply source 70 may have a function of generating DHF by diluting HF supplied from a supply source of HF (hydrofluoric acid) with DIW (deionized water) supplied from a supply source of DIW. In this case, the DIW supply source and the HF supply source may be provided as power usage of a factory of a semiconductor device manufacturing plant. The processing liquid supply source 70 may include a tank (a tank separate from the tank 10) that stores a processing liquid compounded in advance. The processing liquid supply source 70 may supply a processing liquid obtained by mixing a plurality of components, or may supply a processing liquid having a single component.

Figure 2:
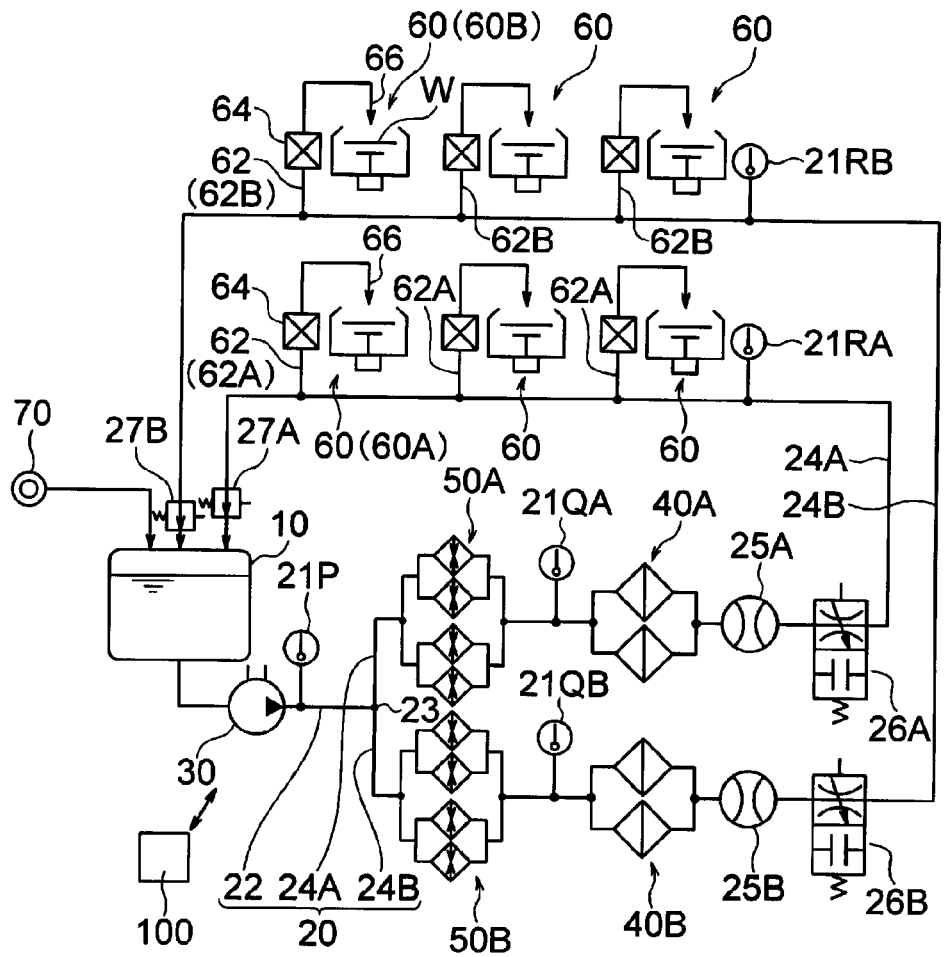
FIG. 2 is a fluid circuit diagram of a liquid processing apparatus according to a second embodiment of the present disclosure.

FIG. 2 shows a liquid processing apparatus according to a second embodiment of the present disclosure. The second embodiment is different from the first embodiment in that a temperature control unit 50A and a filtering part 40A are installed at the first branch passage portion 24A, and a temperature control unit 50B and a filtering part 40B are installed at the second branch passage portion 24B. The temperature control unit 50A (50B) is installed at the upstream side of the filtering part 40A (40B). The temperature control unit 50A (50B) includes four temperature control modules arranged in parallel. The filtering part 40A (40B) includes two filtering modules arranged in parallel. Except for the above matters, the second embodiment has the same configuration as the first embodiment, and explanation thereof will not be repeated.

FIGS. 3 to 6 show an arrangement of a pump 30, a filtering part 40, and a temperature control unit 50 in liquid processing apparatuses according to third to sixth embodiments of the present disclosure in a simplified manner. The third to sixth embodiments include the same elements (60, 21P, 21Q, 21R, 25, 26, and the like.) as the elements of the first and second embodiments, but illustration thereof is not shown.

Figure 3:
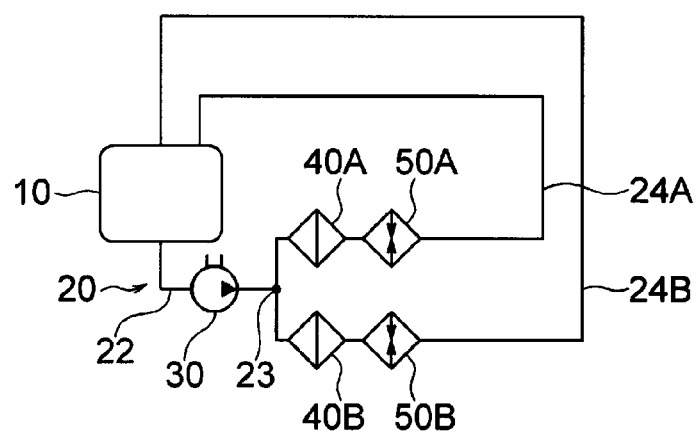
FIG. 3 is a schematic fluid circuit diagram of a liquid processing apparatus according to a third embodiment of the present disclosure.

In the third embodiment shown in FIG. 3, the pump 30 is installed at the main passage portion 22. The filtering part 40A and the temperature control unit 50A are installed at the first branch passage portion 24A. The filtering part 40B and the temperature control unit 50B are installed at the second branch passage portion 24B. Each filtering part 40A and 40B has one filtering module, and each temperature control unit 50A and 50B has one temperature control module.

Figure 4:
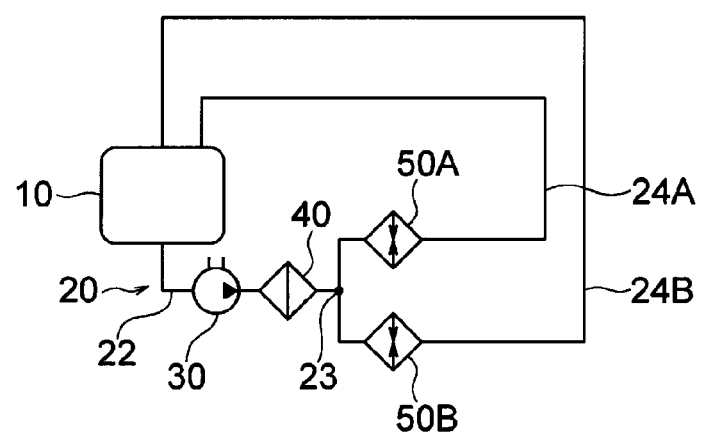
FIG. 4 is a schematic fluid circuit diagram of a liquid processing apparatus according to a fourth embodiment of the present disclosure.

In the fourth embodiment shown in FIG. 4, the pump 30 and the filtering portion 40 are installed at the main passage portion 22. The temperature control unit 50A is installed at the first branch passage portion 24A, and the temperature control unit 50B is installed at the second branch passage portion 24B. The filtering part 40 includes one filtering module, and each temperature control unit 50A and 50B includes one temperature control module.

Figure 5:
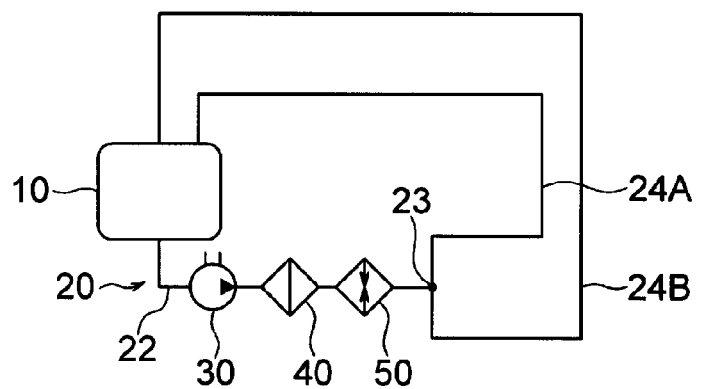
FIG. 5 is a schematic fluid circuit diagram of a liquid processing apparatus according to a fifth embodiment of the present disclosure.

In the fifth embodiment shown in FIG. 5, the pump 30, the filtering part 40, and the temperature control unit 50 are installed at the main passage portion 22. The filtering part 40 includes one filtering module, and the temperature control unit 50 includes one temperature control module.

Figure 6:
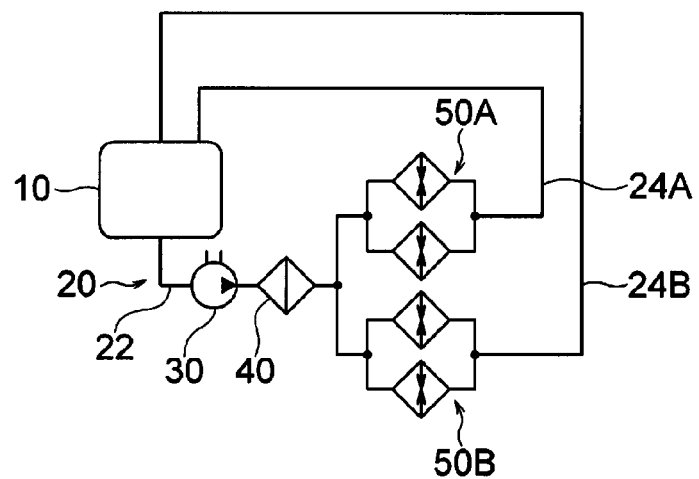
FIG. 6 is a schematic fluid circuit diagram of a liquid processing apparatus according to a sixth embodiment of the present disclosure.

In the sixth embodiment shown in FIG. 6, the pump 30 and the filtering part 40 are installed at the main passage portion 22, the temperature control unit 50A is installed at the first branch passage portion 24A, and the temperature control unit 50B is installed at the second branch passage portion 24B. The sixth embodiment is different from the fourth embodiment in that each temperature control unit 50A and 50B includes two temperature control modules.

What is common to the first to sixth embodiments is that the pump 30 is installed at the main passage portion 22 of the circulation passage 20 and a driving force generated by the common pump 30 causes the processing liquid to circulate in both of the first branch passage portion 24A and the second branch passage portion 24B of the circulation passage 20. As a result, as compared with the configuration in which pumps are respectively provided in two circulation passages, the number of pumps can be reduced and thus an apparatus cost of the liquid processing apparatus can be reduced.

In the fourth embodiment shown in FIG. 4, the filtering part 40 is installed at the main passage portion 22 in addition to the pump 30, and the filtering part 40 includes one filtering module. This configuration can be used when the filtering part 40 does not need high particle collecting capability. According to this configuration, as compared with the third embodiment shown in FIG. 3, the number of filter modules can be reduced and thus the apparatus cost of the liquid processing apparatus can be reduced.

When the filtering part 40 needs the high particle collecting capability, the filtering parts 40A and 40B may be installed at the respective branch passage portions 24A and 24B as in the third embodiment shown in FIG. 3. When higher particle collecting capability is required, as in the second embodiment shown in FIG. 2, the filtering parts 40A and 40B may be installed at the respective branch passage portions 24A and 24B, and each filtering part may include two (or more) filter modules.

In the first embodiment shown in FIG. 1, the filtering part 40 installed at the main passage portion 22 includes three filtering modules installed in parallel. In the first embodiment shown in FIG. 1, as a whole, the filtering capability is increased as compared with the case where two filtering parts 40A and 40B each including one filter module are provided (the third embodiment shown in FIG. 3). By configuring one filtering part 40 with an odd number (three in this case) of filtering modules, when the particle collecting capability required for the entire circulation system can be adequately adapted without excess or deficiency, the filtering part 40 may be installed at the main passage portion 22. As a result, the number of filter modules can be reduced (that is, it possible to avoid installing the filter modules more than required) and thus the apparatus cost of the liquid processing apparatus can be reduced.

In the fifth embodiment shown in FIG. 5, in addition to the pump 30, the filtering part 40 and the temperature control unit 50 are installed at the main passage portion 22, and the temperature control unit 50 includes one temperature control module. This configuration is used when the temperature control unit 50 does not need high temperature control capability. According to this configuration, as compared with the fourth embodiment shown in FIG. 4, the number of temperature control modules can be reduced, and thus the apparatus cost of the liquid processing apparatus can be reduced.

When the temperature control unit 50 needs the high temperature control capability, the temperature control units 50A and 50B may be installed at the respective branch passage portions 24A and 24B as in the fourth embodiment shown in FIG. 4. When higher temperature control capability is required, the temperature control units 50A and 50B may be installed at the respective branch passage portions 24A and 24B as in the sixth embodiment shown in FIG. 6, and each temperature control unit may include two (or more) temperature control modules.

Similar to the above-described filtering part, one temperature control unit 50 including an odd number (three in this case) of temperature control modules may be installed at the main passage portion 22.

How to determine an arrangement order of the pump 30, the filtering part 40, and the temperature control unit 50 along a flow direction of the processing liquid will be briefly described.

When a temperature control accuracy of the processing liquid supplied to the liquid processing unit 60 is particularly important, the temperature control unit 50 may be installed at the most downstream side in some embodiments. In this case, for example, the pump 30, the filtering part 40, and the temperature control unit 50 can be arranged in order from the upstream side. The embodiments shown in FIGS. 1 and 3 to 6 correspond to this arrangement.

When it is particularly important to reduce an amount of particles contained in the processing liquid supplied to the liquid processing unit 60, the filtering part 40 may be arranged at the most downstream side in some embodiments. This is because dust may be generated in the temperature control unit 50. In this case, for example, the pump 30, the temperature control unit 50, and the filtering part 40 can be arranged in order from the upstream side. For example, when the processing liquid is isopropyl alcohol (IPA) used as a drying solvent, this arrangement may be used in some embodiments. The embodiments of FIGS. 2 and 7 correspond to this arrangement.

Some temperature control modules, such as heater modules, that constitute the temperature control unit 50 may have low pressure resistance. In this case, in order to prevent damage to the temperature control modules, the temperature control unit 50 may be on the upstream side of the pump 30 in some embodiments. In this case, for example, the temperature control unit 50, the pump 30, and the filtering part 40 can be arranged in order from the upstream side.

Figure 7:
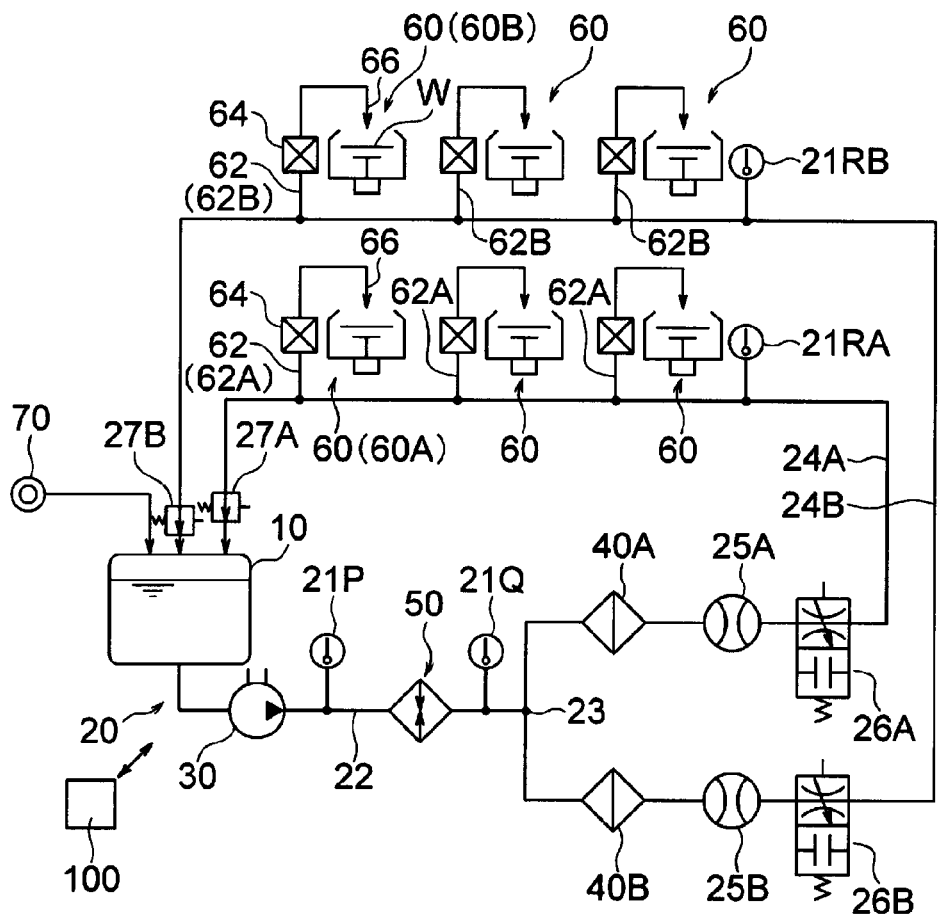
FIG. 7 is a fluid circuit diagram of a liquid processing apparatus according to a seventh embodiment of the present disclosure.

FIG. 7 shows a liquid processing apparatus according to a seventh embodiment of the present disclosure. In the seventh embodiment, the pump 30 and the temperature control unit 50 are installed at the main passage portion 22, and the filtering parts 40A and 40B are installed at the respective branch passage portions 24A and 24B. The other elements of the seventh embodiment are the same as the elements of the first and second embodiments shown in FIGS. 1 and 2, and explanation thereof will not be repeated.

Figure 8:
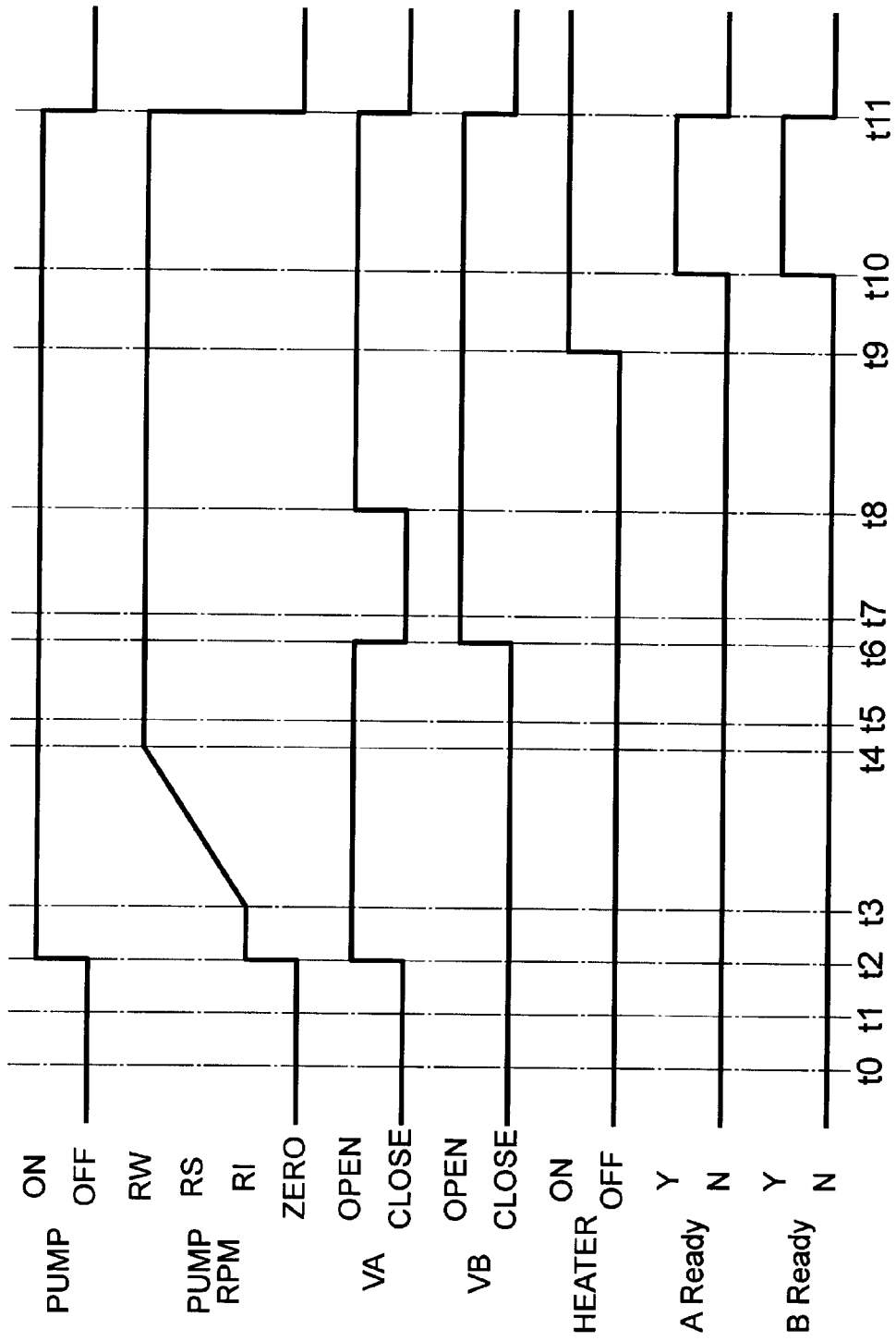
FIG. 8 is a time chart for explaining operations of the liquid processing apparatus according to the seventh embodiment of the present disclosure.
Figure 9:
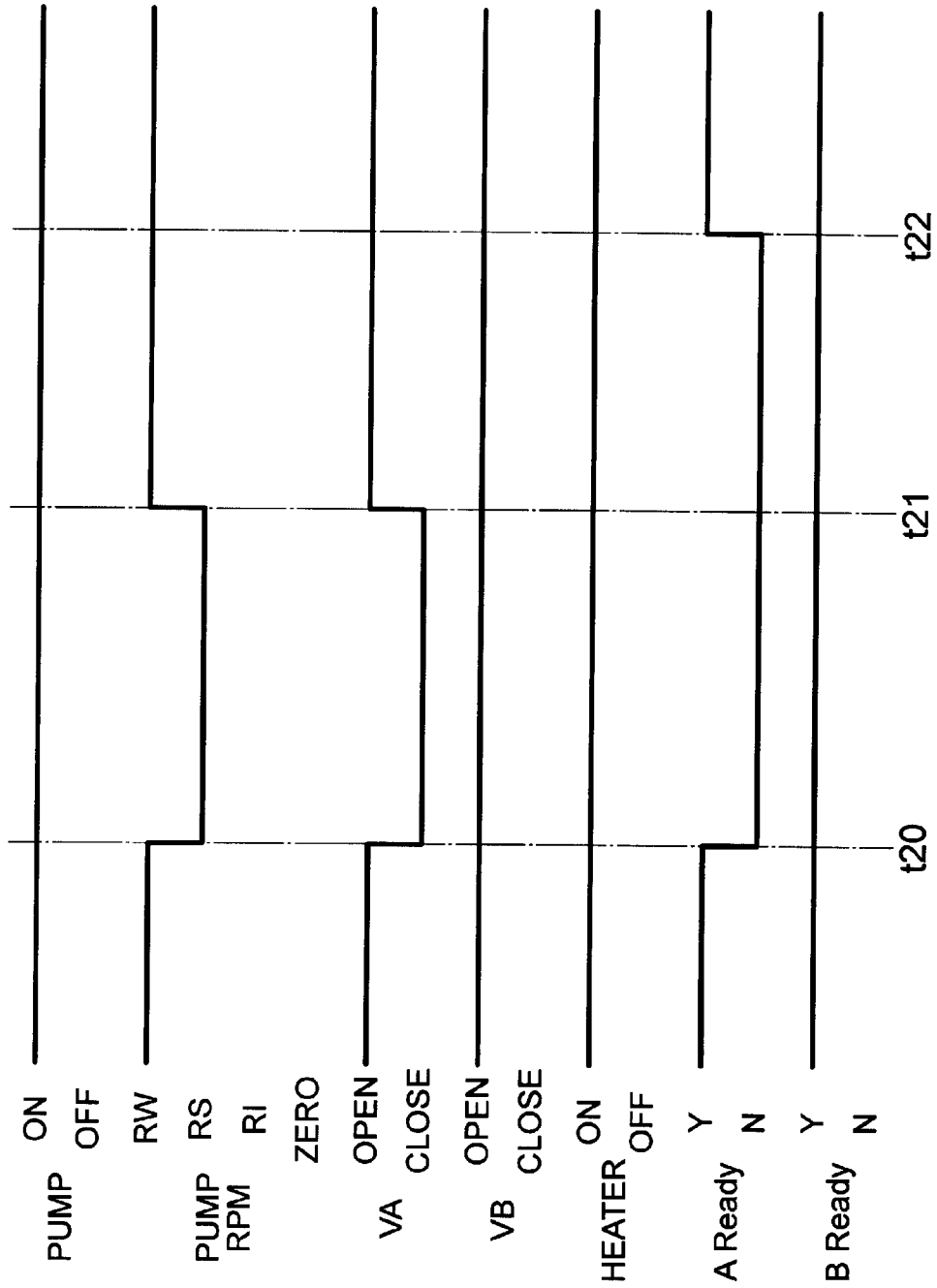
FIG. 9 is a time chart for explaining the operations of the liquid processing apparatus according to the seventh embodiment of the present disclosure.
Figure 10:
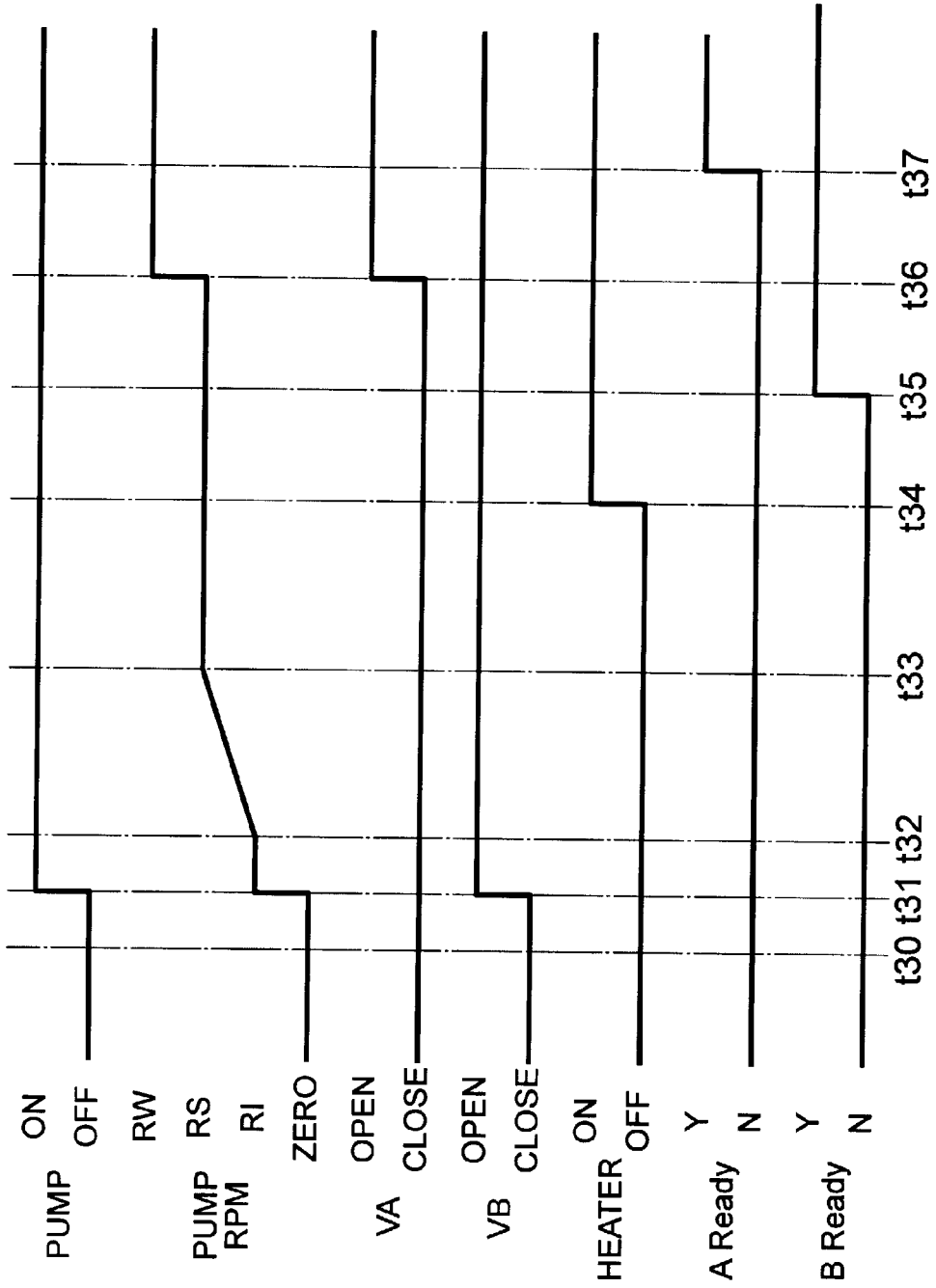
FIG. 10 is a time chart for explaining the operations of the liquid processing apparatus according to the seventh embodiment of the present disclosure.

FIGS. 8 to 10 are time charts for explaining operations of the liquid processing apparatus according to the seventh embodiment. The items in the time chart are as follows. The operation to be described below can be automatically executed under the control of the controller 100 according to recipes stored in the controller 100.

"PUMP": indicates whether the pump 30 is operating (ON) or stopped (OFF).

"PUMP RPM": indicates a rotation speed of the pump 30. "ZERO" is zero rotation, "RI" is low rotation at the time of start-up, "RS" is medium rotation when the processing liquid flows into only one branch passage portion 24A or 24B, and "RW" is high rotation when the processing liquid is flowed into both the branch passage portions 24A and 24B, respectively. ZERO<RI<RS<RW.

"VA": indicates whether the opening/closing valve 26A of the first branch passage portion 24A is opened (OPEN) or closed (CLOSE).

"VB": indicates whether the opening/closing valve 26B of the second branch passage portion 24B is opened (OPEN) or closed (CLOSE).

"HEATER": indicates whether the temperature control module (here, an electric heater module) of the temperature control unit 50 is energized (ON) or not energized (OFF). In the case of "ON," the electric power supplied to the electric heater module is not constant because it is feedback-controlled.

"A Ready": indicates whether the supply of processing liquid to the liquid processing unit 60A connected to the first branch passage portion 24A can be ready (ON) or not be ready (OFF).

"B Ready": indicates whether the supply of processing liquid to the liquid processing unit 60B connected to the second branch passage portion 24B can be ready (ON) or not be ready (OFF).

First, the operation at the time of start-up of the liquid processing apparatus will be described with reference to the time chart of FIG. 8.

Now, assume that the tank 10 is empty. From this state, the supply of the processing liquid from the processing liquid supply source 70 to the tank 10 is started (time t0) with both the opening/closing valves 26A and 26B closed. At this time, the pump is stopped (OFF), and the electric heater module of the temperature control unit 50 is not energized (OFF).

When it is detected by a liquid level sensor (not shown) that a liquid level of the processing liquid in the tank 10 rises to reach a predetermined lower limit liquid level or more (time t1), after a predetermined delay time elapses (time t2), only one opening/closing valve 26A is opened to start the pump 30. As a result, a circulating flow of the processing liquid is formed from the tank 10, through the main passage portion 22 and the first branch passage portion 24A, to the tank 10. At this time, the processing liquid does not flow into the second branch passage portion 24B.

The pump 30 starts at low rotation (RI), holds the low rotation (RI) for a predetermined time (time t3), and then gradually increases the rotation speed to high rotation (RW). If the rotation speed of the pump 30 is increased to the high rotation (RW) at the same time with the start-up, a differential pressure between a primary side and a secondary side of the filter module of the filtering part 40A temporarily becomes excessive, which may do damage to the filter module (for example, the filter element). By starting up the pump 30 in the procedure described above, it is possible to prevent the filter module from being damaged.

When the rotation speed of the pump 30 becomes the high rotation (RW) (time t4), after the elapse of a predetermined delay time (for example, about 10 seconds) (time t5), the monitoring of the processing liquid flow rate in the branch passage portion 24A by the flow meter 25A is started. If a predetermined time has elapsed from time t4 (time t6) and there is no problem in the result of the flow rate monitoring by the flow meter 25A, the opening/closing valve 26B is opened and the opening/closing valve 26A is closed. As a result, a circulating flow of the processing liquid is formed from the tank 10, through the main passage portion 22 and the second branch passage portion 24B, to the tank 10. At this time, the processing liquid does not flow into the first branch passage portion 24A.

After the lapse of a predetermined delay time (for example, about 10 seconds) from time t6 (time t7), the flow meter 25B starts monitoring the flow rate of the processing liquid in the branch passage portion 24B. When a predetermined time has elapsed from time t6 (time t8) and there is no problem in the result of the flow rate monitoring by the flow meter 25B, the opening/closing valve 26A is opened with the opening/closing valve 26B being opened. As a result, a circulating flow of the processing liquid is formed from the tank 10 through both the main passage portion 22 and the first and second branch passage portions 24A and 24B, to the tank 10. The time from time t6 to time t8 is, for example, about 60 seconds.

When a predetermined time has passed from time t8 (time t9), power supply to the electric heater module of the temperature control unit 50 is started to start heating the processing liquid. The power supplied to the electric heater module can be controlled by a temperature control method using the above-described feedback control (which may be combined with the feedforward control).

In the seventh embodiment, the temperature control unit 50 installed at the main passage portion 22 heats the processing liquid flowing into both the first and second branch passage portions 24A and 24B. In this case, a difference between the temperature detected by only one temperature sensor 21Q and the temperature detected by one (for example, the temperature sensor 21RA) of the temperature sensors 21RA and 21RB can be used to calculate the above-described correction value (CV). An average value of the temperature detected by the temperature sensor 21RA and the temperature detected by the temperature sensor 21RB may be used to calculate the correction value (CV).

After starting the heating of the processing liquid, the temperature control unit 50 stands by until the temperature of the processing liquid becomes stable at a target temperature. When the temperature of the processing liquid becomes stable (time t10), the preparation for supplying the processing liquid to all the liquid processing units 60 connected to both the first and second branch passage portions 24A and 24B is completed (Ready state). Thereafter, processing is performed in each liquid processing unit 60 according to a predetermined processing schedule. At this time, the processing liquid is supplied to each liquid processing unit 60A and 60B at a flow rate controlled by the flow control device 64 via the supply passages 62A and 62B branching from the branch passage portions 24A and 24B.

When all scheduled liquid processing in the liquid processing unit 60 are completed, the pump 30 is stopped, the opening/closing valves 26A and 26B are closed, and the supply of power to the electric heater module of the temperature control unit 50 is stopped (time t11).

According to the above-described embodiments, in the state where the pump 30 is driven at the high rotation speed (RW) used when the processing liquid is caused to flow into both the branch passage portions 24A and 24B, first, the processing liquid is caused to flow at a large flow rate into only one branch passage portion 24A, and then the processing liquid is caused to flow at a large flow rate into only the other branch passage portion 24B. Here, the "large flow rate" is, for example, about twice the flow rate of the processing liquid flowing through one branch passage portion 24A and 24B during the normal operation of the liquid processing apparatus. However, the "large flow rate" here may be a flow rate that is larger than the flow rate of the processing liquid flowing through one branch passage portion 24A or 24B during the normal operation of the liquid processing apparatus (when the processing parts 60A and 60B perform processing sequentially as scheduled). By performing such an operation, the air (air bubbles) remaining in the circulation passage 20 (the main passage portion 22 and the first and second branch passage portions 24A and 24B) can be discharged in a short time. Therefore, the preparation for supplying the processing liquid to all the liquid processing units 60 connected to both the branch passage portions 24A and 24B can be completed in a short time. During the normal operation of the liquid processing apparatus, it is desirable that no air (air bubbles) be present in the circulation passage 20.

Next, the operation (stop and restart of operation) when an error occurs in an element of the liquid processing apparatus pertaining to one (here, the first branch passage portion 24A) of the first and second branch passage portions 24A and 24B will be described with reference to the time chart of FIG. 9. This example relates to a procedure of stopping the supply of the processing liquid to the first branch passage portion 24A when an error is detected, and then restarting the supply of the processing liquid to the first branch passage portion 24A when the error is resolved.

This operation is started from the state (Ready state) between time t10 and time t11 of the liquid processing apparatus in the time chart of FIG. 8. At time t20 in FIG. 9 (corresponding to the time between time t10 and time t11), it is assumed that an error has occurred in the element of the liquid processing apparatus pertaining to the first branch passage portion 24A.

An error which may stop supplying the processing liquid to one branch passage portion 24A (24B) may include, for example, leakage of the processing liquid from a pipe pertaining to the first branch passage portion 24A, failure of the temperature control unit 50A pertaining to the first branch passage portion 24A, decrease of an exhaust pressure in the liquid processing unit 60A, opening of a maintenance panel on the liquid processing unit 60A side, and the like.

In addition, An error which may stop supplying the processing liquid to both the branch passage portions 24A and 24B may include, for example, failure of the pump 30, failure of the tank 10 and sensors (liquid level sensor, and the like) pertaining to the tank 10, leakage that have occurred in the main passage portion 22, opening of a panel of a processing liquid supply cabinet (a portion that houses a tank, a pipe, and the like), and the like.

When an error is detected at time t20, the rotation speed of the pump 30 is reduced to the medium rotation RS suitable for the processing liquid to flow into only one branch passage portion 24A or 24B, and the opening/closing valve 26A is closed. As a result, the processing liquid does not flow into the first branch passage portion 24A, and the processing liquid flows into only the second branch passage portion 24B. The flow rate of the processing liquid flowing through the second branch passage portion 24B does not substantially change before and after time t20. Therefore, the liquid processing can be continuously performed in all the liquid processing units 60 connected to the second branch passage portion 24B.

When the value detected by the temperature sensor 21RA is used for calculating the above-described correction value (CV) until time t20, the above-described feedback control system is switched such that the value detected by the temperature sensor 21RB is used for calculating the correction value (CV).

Before and after time t20, since the flow rate of the processing liquid passing through the electric heater module of the temperature control unit 50 is halved, the power supplied to the electric heater module of the temperature control unit 50 may be temporarily reduced within a predetermined period after time t20. If the feedback control system has sufficient control responsiveness, such an operation need not be performed.

When it is detected that the error has been resolved (time t21), the rotational speed of the pump 30 is increased to the high rotation speed RW suitable for the processing liquid to flow into both the branch passage portions 24A and 24B, and the opening/closing valve 26A with an opening adjustment function is opened. As a result, the processing liquid also flows into the first branch passage portion 24A, and thus the processing liquid flows into both the first and second branch passage portions 24A and 24B.

After time t21, when the temperature and flow rate of the processing liquid in the first branch passage portion 24A in which the processing liquid has not flowed become stable (time t22), the preparation for supplying the processing liquid to all the liquid processing units 60 connected to the branch passage portion 24A is completed (Ready state). That is, it becomes possible to perform the liquid processing in all the liquid processing units 60 connected to the first and second branch passage portions 24A and 24B.

The temperature of the first branch passage portion 24A (pipe wall) where the processing liquid did not flow until time t21 has dropped. Therefore, it may be determined based on the temperature detected by the temperature sensor 21RA that the temperature of the processing liquid flowing through the first branch passage portion 24A is stable. The stabilization of the flow rate of the processing liquid flowing through the first branch passage portion 24A can be determined based on the value detected by the flow meter 25A.

Next, an operation of restarting when an error occurs in the element of the liquid processing apparatus pertaining to both the first and second branch passage portions 24A and 24B will be described with reference to the time chart of FIG. 10. This operation assumes a case where the error in the element of the liquid processing apparatus pertaining to the second branch passage portion 24B is resolved and then the error in the element of the liquid processing apparatus pertaining to the first branch passage portion 24A is resolved.

The state of the liquid processing apparatus at time t30 is equivalent to the state of the liquid processing apparatus immediately after time t11 in the time chart of FIG. 8. That is, the entire area inside the circulation passage 20 is substantially filled with the processing liquid.

At time t31, it is assumed that the error in the element of the liquid processing apparatus pertaining to the second branch passage portion 24B has been resolved. Then, the opening/closing valve 26B of the second branch passage portion 24B is opened and the pump 30 is started. As a result, a circulating flow of the processing liquid is formed from the tank 10, through the main passage portion 22 and the second branch passage portion 24B, to the tank 10. At this time, the processing liquid does not flow into the first branch passage portion 24A.

The pump 30 starts at low rotation (RI), holds the low rotation (RI) for a predetermined time (time t32), and then gradually increases the rotation speed to medium rotation (RS). The reason why the rotation speed of the pump 30 is gradually increased is to prevent the filter module from being damaged as described above.

When the rotation speed of the pump 30 becomes the medium rotation (RS) (time t33), after a predetermined delay time (for example, about 10 seconds) elapses, monitoring of the flow rate of the processing liquid in the second branch passage portion 24B by the flow meter 25B is started. When the flow rate becomes stable (time t34), supply of power to the electric heater module of the temperature control unit 50 is started to start heating the processing liquid. The supply of power to the electric heater module can be controlled by the temperature control method using the above-described feedback control (which may be combined with the feedforward control). At this time, the temperature detected by the temperature sensor 21RB is used to calculate the above-described correction value (CV). After that, when the temperature of the processing liquid becomes stable (time t35), the preparation for supplying the processing liquid to all the liquid processing units 60 connected to the second branch passage portion 24B are completed (Ready state).

At time t36, it is assumed that the error in the element of the liquid processing apparatus pertaining to the first branch passage portion 24A has been resolved. Then, the opening/closing valve 26A of the first branch passage portion 24A is opened. This causes the processing liquid to flow through both the first and second branch passage portions 24A and 24B. Monitoring of the flow rate of the processing liquid in the first branch passage portion 24A by the flow meter 25A is also started. When the temperature of the processing liquid and the flow rate of the processing liquid in the first branch passage portion 24A become stable (time t37), the preparation of supplying the processing liquid to all the liquid processing units 60 connected to the first branch passage portion 24A is also completed (Ready state). As described above, the liquid processing apparatus is returned to the normal operation state.

Figure 11:
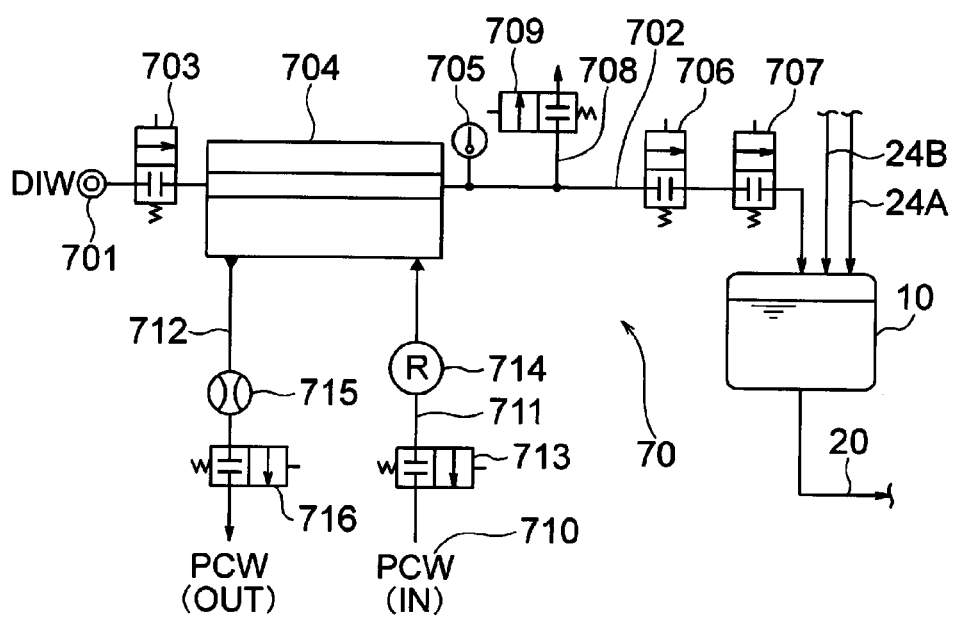
FIG. 11 is a fluid circuit diagram showing an example of a configuration of a processing liquid supply source.

An example of the configuration of the processing liquid supply source 70 will be described with reference to FIG. 11. As described above, the processing liquid is DHF, and it is assumed that the processing liquid supply source 70 produces DHF by diluting HF supplied from the HF supply source with DIW supplied from the DIW supply source. The temperature of the DIW supplied from the DIW supply source for the power usage of a factory may be higher than a desired temperature. In this case, if the temperature control module of the temperature control unit 50 installed at the circulation passage 20 does not have a sufficient cooling function, the temperature of the processing liquid may not be controlled to the desired temperature (for example, a temperature around the room temperature). The configuration shown in FIG. 11 may be applied to such a case.

DIW is supplied from a DIW supply source 701 to the tank 10 via a DIW supply line 702. At the DIW supply line 702, an opening/closing valve 703, a heat exchanger 704, a temperature sensor 705, an opening/closing valve 706, and an opening/closing valve 707 are installed in order from the upstream side. A return line 708 branches from the DIW supply line 702 between the temperature sensor 705 and the opening/closing valve 706. An opening/closing valve 709 is installed at the return line 708.

As a cooling medium, PCW (Plant Cooling Water) is supplied from a PCW supply source 710, which is provided as the power usage of a factory, to the heat exchanger 704 via a PCW supply line 711. The PCW supplied to the heat exchanger 704 is discharged via a PCW discharge line 712. At the PCW supply line 711, an opening/closing valve 713 and a flow rate control device (for example, a flow rate control valve) 714 are installed in order from the upstream side. At the PCW discharge line 712, a flow meter 715 and an opening/closing valve 716 are installed in order from the upstream side. The PCW cools the DIW by exchanging heat with the DIW passing through the heat exchanger 704.

The operation of the processing liquid supply source 70 of FIG. 11 will be described. The operation of the processing liquid supply source 70 can also be performed under the control of the above-described controller 100. The opening/closing valve 703 and the opening/closing valve 709 are opened, and the opening/closing valve 706 is closed. The DIW supplied from the DIW supply source 701 passes through the heat exchanger 704, flows into the return line 708, and is returned (or discarded) to the DIW supply source 701. In this state, when the temperature detected by the temperature sensor 705 is higher than the desired temperature, the opening/closing valves 713 and 716 are opened, the PCW is supplied from the PCW supply line 711 to the heat exchanger 704, and the DIW passing through the heat exchanger 704 is cooled. Based on the temperature detected by the temperature sensor 705, the flow rate control device 714 controls the flow rate of the PCW passing through the heat exchanger 704 such that the temperature of the DIW detected by the temperature sensor 705 becomes a desired temperature. When the temperature of the DIW become stable within a desired range, the opening/closing valve 709 is closed and the opening/closing valves 706 and 707 are opened. This will ensure that the DIW in the desired temperature range is supplied to the tank 10.

The HF supplied from the HF supply source (not shown) may be directly supplied to the tank 10 and mixed with the DIW in the tank 10. The HF supplied from the HF supply source (not shown) may be supplied to the DIW supply line 702 by an HF supply line (not shown) connected between the opening/closing valve 706 and the opening/closing valve 707, for example. In this case, the DHF generated when the DIW is mixed with the HF in the DIW supply line 702 is supplied to the tank 10.

The heat exchanger 704 is not limited to one that cools a liquid having a high temperature, but may heat a liquid having a low temperature.

According to the present disclosure in some embodiments, it is possible to reduce the number of parts of a processing liquid supply mechanism of a liquid processing apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A liquid processing method using a liquid processing apparatus including a tank configured to store a processing liquid supplied from a processing liquid supply source, a circulation passage connected to the tank, a pump installed at the circulation passage, a plurality of liquid processors configured to perform liquid processing on a substrate, a plurality of supply passages configured to supply the processing liquid to the plurality of liquid processors respectively, a first opening/closing valve installed at a first branch passage portion, and a second opening/closing valve installed at a second branch passage portion, wherein the circulation passage includes a main passage portion provided with the pump, and the first branch passage portion and the second branch passage portion branch from the main passage portion, the method comprising:

starting a supply of the processing liquid from the processing liquid supply source;

opening only the first opening/closing valve to allow_the processing liquid to flow into only the first branch passage portion;

after a first predetermined time, opening the second opening/closing valve and closing the first opening/closing valve to allow the processing liquid to flow into only the second branch passage portion; and after a second predetermined time, opening the first opening/closing valve with the second opening/closing valve being opened to allow the processing liquid to flow into both the first branch passage portion and the second branch passage portion, wherein the processing liquid flowing out from the tank passes through the main passage portion, then flows into the first branch passage portion and the second branch passage portion, and then returns to the tank through the first branch passage portion and the second branch passage portion, wherein the liquid processors are divided into a first processor group to which a portion of the liquid processors belong and a second processor group to which another portion of the liquid processors belong, wherein the plurality of supply passages are divided into a first passage group to which a portion of the plurality of supply passages belong and a second passage group to which another portion of the plurality of supply passages belong, wherein the liquid processors belonging to the first processor group are connected to the first branch passage portion via the supply passages belonging to the first passage group respectively, and wherein the liquid processors belonging to the second processor group are connected to the second branch passage portion via the supply passages belonging to the second passage group respectively.

2. The liquid processing method of claim 1, wherein a flow rate of the processing liquid flowing through the first branch passage portion in the opening only the first opening/closing valve and a flow rate of the processing liquid flowing through the second branch passage portion in the opening the second opening/closing valve and closing the first opening/closing valve are larger than a flow rate of the processing liquid flowing through each of the first branch passage portion and the second branch passage portion in the opening the first opening/closing valve with the second opening/closing valve being opened.

3. The liquid processing method of claim 1, wherein the liquid processing apparatus further includes a temperature controller and a filter provided in the main passage portion and configured to filter the processing liquid, and wherein the temperature controller includes: a first temperature controller installed at the first branch passage portion; and a second temperature controller installed at the second branch passage portion.

4. The liquid processing method of claim 3, wherein the filter includes a plurality of filter modules installed in parallel with the main passage portion.

5. The liquid processing method of claim 1, wherein the liquid processing apparatus further includes:

a first filter installed at the first branch passage portion; and a second filter installed at the second branch passage portion.

6. The liquid processing method of claim 5, wherein the liquid processing apparatus further includes a temperature controller, and wherein the temperature controller includes:

a first temperature controller installed at the first branch passage portion; and a second temperature controller installed at the second branch passage portion.

7. The liquid processing method of claim 1, wherein the processing liquid supply source includes:
   a liquid supply line configured to supply the processing liquid itself or a liquid as a constituent component of the processing liquid to the tank; and
   an additional temperature controller installed at the liquid supply line and configured to control the temperature of the liquid.

8. The liquid processing method of claim 7, wherein the liquid is provided from power usage of a factory, and the additional temperature controller is a heat exchanger configured to perform cooling by using plant cooling water as a cooling medium.

9. The liquid processing method of claim 1, further comprising:
   recognizing an abnormality in the first branch passage portion, and
   wherein, in the opening the first opening/closing valve with the second opening/closing valve being opened to allow the processing liquid to flow into both the first branch passage portion and the second branch passage portion, the first opening/closing valve is closed and a discharge amount of the pump is reduced under a condition in which the abnormality in the first branch passage portion is recognized.

10. The liquid processing method of claim 1, wherein the liquid processing apparatus further includes:
   a temperature controller installed at the circulation passage and configured to control a temperature of the processing liquid flowing through the circulation passage;
   a first temperature sensor installed at the circulation passage at a position downstream of the temperature controller;
   a second temperature sensor installed at the circulation passage between the tank and the temperature controller, and
   wherein the liquid processing method further comprises:
   feedback-controlling the temperature controller based on at least a temperature detected by the first temperature sensor; and
   controlling the temperature controller in conjunction with a feedforward control based on a temperature detected by the second temperature sensor under a condition in which the processing liquid is replenished from the processing liquid supply source into the tank.

* * * * *